(12) United States Patent
Sheng et al.

(10) Patent No.: US 11,289,944 B2
(45) Date of Patent: Mar. 29, 2022

(54) DISTRIBUTION NETWORK RISK IDENTIFICATION SYSTEM AND METHOD AND COMPUTER STORAGE MEDIUM

(71) Applicants: CHINA ELECTRIC POWER RESEARCH INSTITUTE COMPANY LIMITED, Beijing (CN); STATE GRID CORPORATION OF CHINA, Beijing (CN)

(72) Inventors: Wanxing Sheng, Beijing (CN); Xiaohui Song, Beijing (CN); Yu Zhang, Beijing (CN); Jianfang Li, Beijing (CN); Fei Gao, Beijing (CN); Yajie Li, Beijing (CN); Shanshan Zhao, Beijing (CN)

(73) Assignees: CHINA ELECTRIC POWER RESEARCH INSTITUTE COMPANY LIMITED, Beijing (CN); STATE GRID CORPORATION OF CHINA, Beijing (CN)

( * ) Notice: Subject to any disclaimer, the term of this patent is extended or adjusted under 35 U.S.C. 154(b) by 388 days.

(21) Appl. No.: 16/318,487

(22) PCT Filed: Nov. 3, 2017

(86) PCT No.: PCT/CN2017/109416
§ 371 (c)(1),
(2) Date: Jan. 17, 2019

(87) PCT Pub. No.: WO2018/086488
PCT Pub. Date: May 17, 2018

(65) Prior Publication Data
US 2019/0305589 A1    Oct. 3, 2019

(30) Foreign Application Priority Data
Nov. 10, 2016 (CN) .......................... 201610992702.1

(51) Int. Cl.
*H02J 13/00* (2006.01)
*G06F 16/22* (2019.01)
(Continued)

(52) U.S. Cl.
CPC ........ *H02J 13/0006* (2013.01); *G05B 19/042* (2013.01); *G06F 16/2228* (2019.01);
(Continued)

(58) Field of Classification Search
CPC ... H02J 13/0006; H02J 13/00; G06F 16/2228; G06F 30/00; G05B 19/042;
(Continued)

(56) References Cited

U.S. PATENT DOCUMENTS

2005/0033481 A1*  2/2005  Budhraja ................ H02J 3/008
                                                                700/286
2010/0241608 A1*  9/2010  Huang .................. G06Q 20/10
                                                                706/52
(Continued)

FOREIGN PATENT DOCUMENTS

CN     102130503 A    7/2011
CN     102289582 A   12/2011
(Continued)

OTHER PUBLICATIONS

Yu Zhang, Research on Risk Warning System of Distribution Network, Oct. 20-22, 2014, 2014 International Conference on Power System Technology, Entire document (Year: 2014).*
(Continued)

*Primary Examiner* — Thomas C Lee
*Assistant Examiner* — Ameir Myers
(74) *Attorney, Agent, or Firm* — Syncoda LLC; Feng Ma

(57) ABSTRACT

A distribution network risk identification system and method and a computer storage medium include: multi-source information data for risk identification is acquired; the multi-
(Continued)

source information data is analyzed and processed to obtain a risk characteristic; a risk identification index is calculated on the basis of the risk characteristic, and a state of a power grid is determined according to the risk identification index; a temporal and spatial variation rule and variation trend of the risk characteristic are analyzed; a location and cause of occurrence of a risk are determined according to the temporal and spatial variation rule and variation trend of the risk characteristic; a severity of the risk is analyzed by adopting an analogue simulation manner; and the severity of the risk is assessed, and risk early warning information is issued on the basis of an assessment result.

18 Claims, 2 Drawing Sheets

(51) Int. Cl.
    G05B 19/042    (2006.01)
    G06N 3/04      (2006.01)
    G06Q 50/06     (2012.01)
    G06Q 10/06     (2012.01)
    G06F 30/00     (2020.01)
(52) U.S. Cl.
    CPC .......... G06F 30/00 (2020.01); G06N 3/0436 (2013.01); G06Q 10/06 (2013.01); G06Q 50/06 (2013.01); H02J 13/00 (2013.01); G05B 2219/2639 (2013.01)
(58) Field of Classification Search
    CPC ......... G05B 2219/2639; G06N 3/0436; G06Q 10/06; G06Q 50/06; G06Q 10/0635
    See application file for complete search history.

(56)  References Cited

U.S. PATENT DOCUMENTS

| | | | | |
|---|---|---|---|---|
| 2012/0053983 | A1* | 3/2012 | Vittal | F03D 80/50 705/7.28 |
| 2014/0025211 | A1* | 1/2014 | Cheim | H02J 13/00034 700/286 |
| 2014/0137257 | A1* | 5/2014 | Martinez | H04L 63/1433 726/25 |
| 2015/0120912 | A1* | 4/2015 | Tewari | H04L 43/045 709/224 |
| 2016/0294800 | A1* | 10/2016 | Oppenheim, Jr. | G06F 16/2455 |
| 2020/0050631 | A1* | 2/2020 | Terblanche | G06K 9/00718 |

FOREIGN PATENT DOCUMENTS

| | | |
|---|---|---|
| CN | 102708411 A | 10/2012 |
| CN | 102841582 A | 12/2012 |
| CN | 103427417 A | 12/2013 |
| CN | 103632311 A | 3/2014 |
| CN | 103971182 A | 8/2014 |
| CN | 104217261 A | 12/2014 |
| CN | 104218672 A | 12/2014 |
| CN | 104574217 A | 4/2015 |

OTHER PUBLICATIONS

International Search Report in the international application No. PCT/CN2017/109416, dated Feb. 7, 2018.
English translation of the Written Opinion of the International Search Authority in the international application No. PCT/CN2017/109416, dated Feb. 7, 2018.
"Research on Operational Risk Assessment and Control for Power System", Deng Bin, School of Electrical Engineering, Feb. 2014.

* cited by examiner

DISTRIBUTION NETWORK RISK IDENTIFICATION SYSTEM AND METHOD AND COMPUTER STORAGE MEDIUM

CROSS-REFERENCE TO RELATED APPLICATIONS

The present application claims benefit of Chinese Patent Application No. 201610992702.1, filed on Nov. 10, 2016, the contents of which are hereby incorporated by reference in its entirety.

TECHNICAL FIELD

The disclosure relates to a risk identification method, and particularly to a distribution network risk identification system and method and a computer storage medium.

BACKGROUND

A distribution network structure formed by overhead lines, cables, towers, distribution transformers, isolating switches, reactive compensation capacitors, some auxiliary facilities and the like is large and complex, and plays an important role in power distribution in a power grid, and the network structure frequently changes due to failures or switching-on/off of switches during load transfer operations. High-voltage distribution networks (35-110 KV), medium-voltage distribution networks (6-10 KV) and low-voltage distribution networks (220/380V) may be divided according to voltage classes. A distribution network is directly oriented to terminal users, has multiple points, large coverage and a complex structure, and gradually becomes an active network accessed by distributed generations and diversified loads, and distribution network failure risks and power quality risks increase. Meanwhile, along with development of the social economy and improvement of educational and living levels of the masses, requirements on power supply security and reliability and power supply quality increase. Therefore, how to seek for and find a potential risk before occurrence of a failure and effectively identify a risk type, risk cause and risk source location after an accident is one of important subjects required to be researched for a distribution network.

At present, researches made at home and abroad on the aspect of risk early warning of distribution networks focus mainly on three aspects of probability-based static security risk assessment, analytic hierarchy process-based multi-index synthetical analysis evaluation and online-information-based dynamic security risk assessment, and on such a basis, a distribution network risk assessment system is researched and developed. Although some useful research work on conventional probability-statistics-based power grid risk assessment is developed, there still exist some shortcomings during a practical application: (1) a conventional power grid risk assessment theory and technology place emphasis on establishment of a risk assessment and early warning system from a macro level, an undiversified data source is adopted, a data size is small, relevance between an established risk assessment model and data is poor, a provided risk assessment index is undiversified and unilateral, and types of risks a power grid is confronted with and severities of the risks may not be reflected from multiple dimensions of time, space and the like; (2) a conventional probability-statistics-based power grid risk assessment method only provides a probability of occurrence and severity of a risk of the power grid, and although an overall risk level of the power grid may be reflected, an obtained early warning result may not provide a basis for an operator to find a risk cause and a risk source, and limits formulation of a risk prevention and control measure; and (3) risk mechanism analysis and risk source identification highly depend on data, while at the present stage, information is incomplete, a data size is small, there exists a barrier between data source systems, and it is difficult to perform risk mechanism analysis.

SUMMARY

In order to overcome the shortcomings of a conventional art, embodiments of the disclosure are expected to provide a distribution network risk identification system and method and a computer storage medium.

The embodiments of the disclosure provide a distribution network risk identification method, which includes that:

multi-source information data for risk identification is acquired;

the multi-source information data is analyzed and processed to obtain a risk characteristic;

a risk identification index is calculated on the basis of the risk characteristic, and a state of a power grid is determined according to the risk identification index;

a temporal and spatial variation rule and variation trend of the risk characteristic are analyzed;

a location and cause of occurrence of a risk are determined according to the temporal and spatial variation rule and variation trend of the risk characteristic;

a severity of the risk is analyzed by adopting an analogue simulation manner; and the severity of the risk is assessed, and risk early warning information is issued on the basis of an assessment result.

In an embodiment, the operation that the multi-source information data for risk identification is acquired includes that:

at least one of the following data is acquired: data of a real-time power grid operation monitoring system, dynamic data and static data of an equipment Production Management System (PMS) and external environmental information data.

In an embodiment, the operation that the multi-source information data is analyzed and processed to obtain the risk characteristic includes that: fusion analysis processing is performed on the multi-source information data by adopting at least one of the following processing manners to obtain the risk characteristic: an evidence theory method, a fuzzy set method, a rough set method and a neural network method.

In an embodiment, the operation that the risk identification index is calculated on the basis of the risk characteristic includes that: a risk identification model and an analysis method are selected from a risk identification model base and an analysis method base according to the risk characteristic, and the risk identification index is calculated on the basis of the selected risk identification model and analysis method; and the risk identification index includes at least one of the following index parameters: power quality, an overload, overheat, a low voltage, insulating resistance and a leakage current.

In an embodiment, the operation that the state of the power grid is determined according to the risk identification index includes that: whether the power grid is in a risk state is determined according to a threshold value or limit value corresponding to the risk identification index, a preset risk type and a preset early warning rule.

In an embodiment, the operation that the temporal and spatial variation rule and variation trend of the risk characteristic are analyzed includes that: the temporal and spatial variation rule and variation trend of the risk characteristic are analyzed by adopting a continuous monitoring or statistical method.

In an embodiment, the preset risk type and the preset early warning rule are preset according to related experiential knowledge, or are automatically pre-generated from historical warning records and monitoring statistics by a data mining method.

In an embodiment, the cause of occurrence of the risk is analyzed by adopting a relevance analysis method and/or the evidence theory method.

In an embodiment, the operation that the severity of the risk is analyzed by adopting the analogue simulation manner includes that: Monte Carlo simulation is performed on the risk to obtain a probability of the risk and obtain the severity of the risk.

In an embodiment, the operation that the severity of the risk is assessed and the risk early warning information is issued on the basis of the assessment result includes that:

the risk is comprehensively assessed based on a combination of a risk type, a risk source location, the cause of the risk and the severity of the risk; and the risk early warning information is issued based on a combination of a set risk early warning information evaluation and publication standard.

The embodiments of the disclosure further provide a distribution network risk identification system, which includes: a multi-source information system, a data center, a data analysis and processing module, a risk simulation module, a risk identification modeling and analysis module, a risk source location module, a risk cause identification and analysis module and a risk visualization module, herein the multi-source information system and an intelligent monitoring terminal are connected with the data center through a data interface module and a communication device; the data center transmits data subjected to classification processing to the data analysis and processing module, and the data analysis and processing module is configured to transmit related information data of a risk characteristic to the risk identification modeling and analysis module, the risk source location module and the risk cause identification and analysis module for judgment and early warning of a risk state and a risk type respectively;

the risk visualization module is configured to obtain judgment and early warning result data of the risk identification modeling and analysis module, the risk source location module and the risk cause identification and analysis module and display the judgment and early warning result data; and the data of the data center, the data analysis and processing module, the risk identification modeling and analysis module, the risk source location module and the risk cause identification and analysis module is transmitted to the risk simulation module for online or offline simulation, and a simulation result is transmitted to the risk visualization module.

In an embodiment, a data interface is configured to acquire multi-source information data for risk identification from an intelligent and automatic information system;

the communication device is configured to acquire multi-source information data for risk identification in real time on line from an intelligent terminal or equipment;

the data center is configured to classify, store, maintain and query the data transmitted by the data interface and the communication device;

the data analysis and processing module is configured to perform rapid identification, quality detection, statistical analysis, data mining, characteristic extraction and data fusion on the data transmitted by the data center;

the risk identification modeling and analysis module is configured to analyze and process the data transmitted by the data analysis and processing module, and perform risk characteristic extraction, analysis of a temporal and spatial variation rule of the risk characteristic, risk identification modeling, risk identification index calculation, risk identification index calculation result comparison, risk type judgment and risk variation trend analysis;

the risk source location module is configured to analyze and determine a location of occurrence of a risk;

the risk cause identification and analysis module is configured to analyze and determine a cause of occurrence of the risk;

the risk simulation module is configured to simulate and analyze a severity of the risk;

the risk visualization module is configured to query and display risk early warning information; and the risk identification modeling and analysis module, the risk source location module, the risk cause identification and analysis module and the risk simulation module are connected with a model base, a method base, a knowledge base and a rule base respectively.

In an embodiment, the intelligent monitoring terminal includes at least one of the following terminal types: a mobile monitoring device, an intelligent monitoring terminal, a Feeder Terminal Unit (FTU), a Data Transfer Unit (DTU), a Remote Terminal Unit (RTU), an audio/video acquisition device and a meteorological data acquisition device.

The embodiments of the disclosure further provide a distribution network risk identification system, which includes: a memory, a processor and a computer program stored on the memory and capable of being run on the processor, the processor executing the program to implement the steps of the distribution network risk identification method of the embodiments of the disclosure.

The embodiments of the disclosure further provide a computer storage medium, in which a computer-executable instruction is stored, the computer-executable instruction being configured to execute the steps of the distribution network risk identification method of the embodiments of the disclosure.

According to the technical solutions of the embodiments of the disclosure, on one hand, barriers of various data source systems of a distribution network are broken, and data provided by multiple information sources is effectively fused to provide a data support for accurate distribution network risk identification. On the other hand, distribution network risk identification is performed from multiple dimensions of time, space and the like according to different assessment scenarios, assessment objects, assessment ranges and assessment periods. In addition, the cause and source of occurrence of the risk are searched and found from a micro level, and a decision-making basis is provided for formulation of an effective risk prevention and control measure.

DETAILED DESCRIPTION

In order to make the disclosure better understood, contents of the disclosure will be further described below based on a combination of the drawings and examples of the specification.

Figure 1:
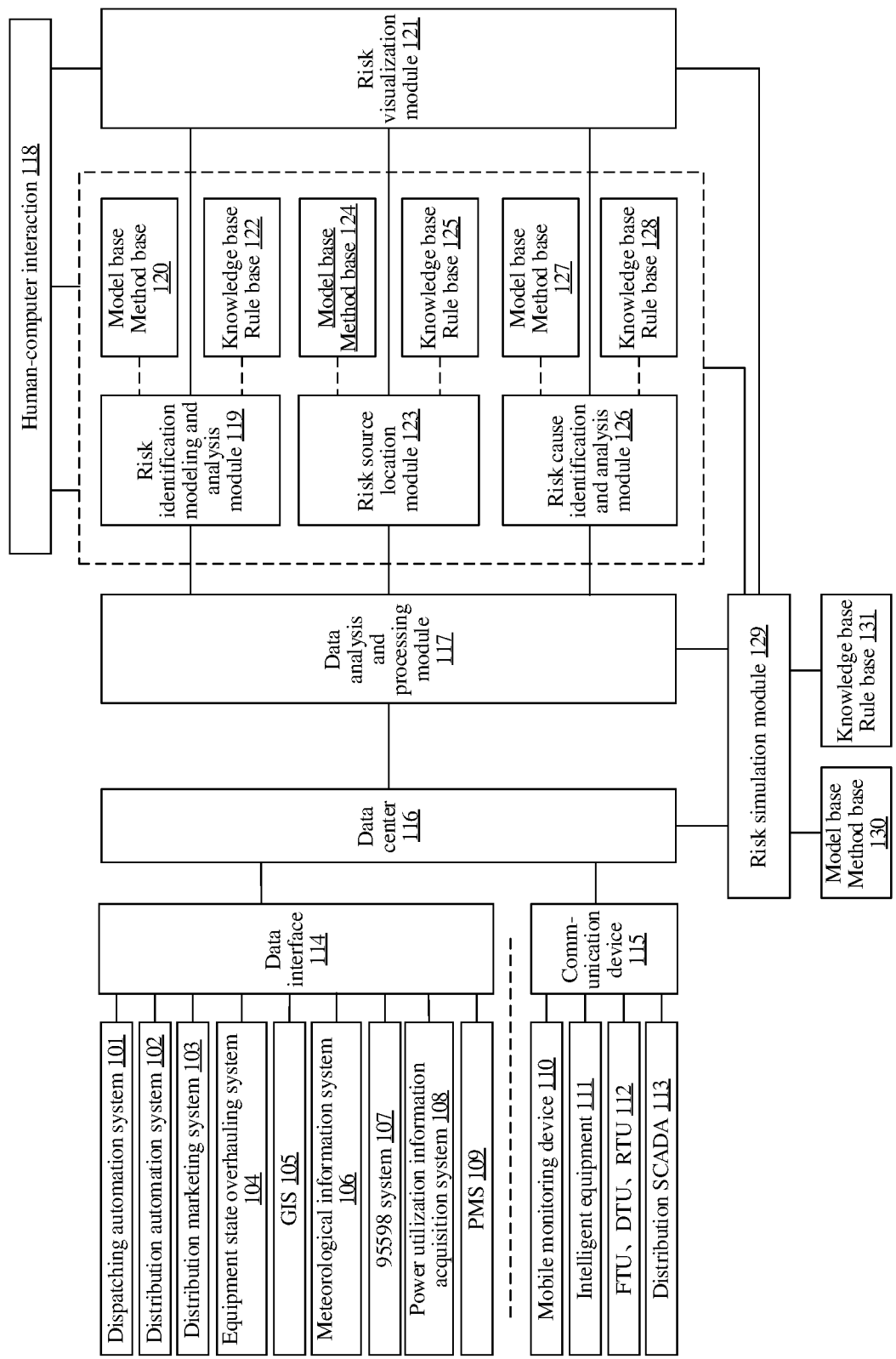
FIG. 1 is an architecture diagram of a distribution network risk identification system according to an embodiment of the disclosure.

The embodiments of the disclosure provide a distribution network risk identification system and method. FIG. 1 is an architecture diagram of a distribution network risk identification system according to the disclosure. As shown in FIG. 1, the system includes: a multi-source information system, a data center (116), a data analysis and processing module (117), a risk simulation module (129), a risk identification modeling and analysis module (119), a risk source location module (123), a risk cause identification and analysis module (126) and a risk visualization module (121), herein the multi-source information system and various intelligent monitoring terminals are connected with the data center (116) through a data interface module (114) and a communication device (115), the data center (116) transmits data subjected to classification processing to the data analysis and processing module for bad data identification, data fusion, risk characteristic extraction and the like, and related information data of a risk characteristic is transmitted to the risk identification modeling and analysis module, the risk source location module and the risk cause identification and analysis module for judgment and early warning of a risk state and a risk type respectively; the risk visualization module (121) is configured to obtain judgment and early warning result data of the risk identification modeling and analysis module, the risk source location module (123) and the risk cause identification and analysis module (126) and display the judgment and early warning result data; and in addition, the data of the data center (116), the data analysis and processing module (117), the risk identification modeling and analysis module (119), the risk source location module (123) and the risk cause identification and analysis module (126) is transmitted to the risk simulation module (129) for online or offline simulation, a simulation result is compared with a practical risk early warning result, simulation result data is finally transmitted to the risk visualization module (121), and the risk early warning result is displayed by the risk virtualization module (121).

Herein, a data interface (114) is configured to acquire multi-source information data for risk identification from an intelligent terminal and an automatic information system;

the communication device (115) is configured to acquire multi-source information data for risk identification in real time on line from the intelligent terminal or equipment;

the data center (116) is configured to classify, store, maintain and query the data transmitted by the data interface and the communication device;

the data analysis and processing module (117) is configured to perform rapid identification, quality detection, statistical analysis, data mining, characteristic extraction, data fusion and the like on the data transmitted by the data center (116);

the risk identification modeling and analysis module (119) is configured to analyze and process the data transmitted by the data analysis and processing module (117), and perform risk characteristic extraction, analysis of a temporal and spatial variation rule of the risk characteristic, risk identification modeling, risk identification index calculation, risk identification index calculation result comparison, risk type judgment, risk variation trend analysis and the like;

the risk source location module (123) is configured to analyze and determine a location of occurrence of a risk;

the risk cause identification and analysis module (126) is configured to analyze and determine a cause of occurrence of the risk;

the risk simulation module (129) is configured to simulate and analyze a severity of the risk;

the risk early warning visualization module (121) is configured to query and display risk early warning information; and a model base/method base/knowledge base/rule base (120, 122, 124, 125, 127, 128) is configured to support calculation and analysis modules of risk identification, risk source location, risk cause identification and analysis, risk simulation and the like.

A human-computer interface (118) is configured to accept a risk identification starting instruction, various risk identification index threshold value parameter modification instructions and risk decision-making instruction input by a user.

The multi-source information data acquired from various intelligent and automatic information systems and required by risk identification specifically includes, but not limited to, real-time data, historical data and predicted data about operation of a power grid, parameter attribute data of a network and equipment, spatial data of geographic information, weather forecasting information, audio/video data and the like acquired from various information, automatic and intelligent systems such as a dispatching automation system (101), a distribution automation system (102), a distribution marketing system (103), an equipment state overhauling system (104), a Geographic Information System (GIS) (105), a meteorological information system (106), a 95598 system (107), a power utilization information acquisition system (108), a PMS (109), a fault recording system, a contamination information system and a lightning monitoring system.

The communication device (115) configured to collect and acquire online real-time data of the intelligent terminal or equipment specifically includes, but not limited to, a wireless transceiver module performing data transmission with the intelligent terminal or equipment such as a mobile monitoring device, an intelligent monitoring terminal, an FTU, a DTU, an RTU, an audio/video acquisition device and a meteorological information acquisition device.

The risk identification modeling and analysis module (119), the risk source location module (123), the risk cause identification and analysis module (126) and the risk simulation module (129) are all connected with the data analysis and processing module (117) to acquire required data resources therefrom; and each module has a corresponding model base, method base, knowledge base and rule base, which may be preset and may also be automatically generated to provide model and method supports for analytical calculation of each module.

Figure 2:
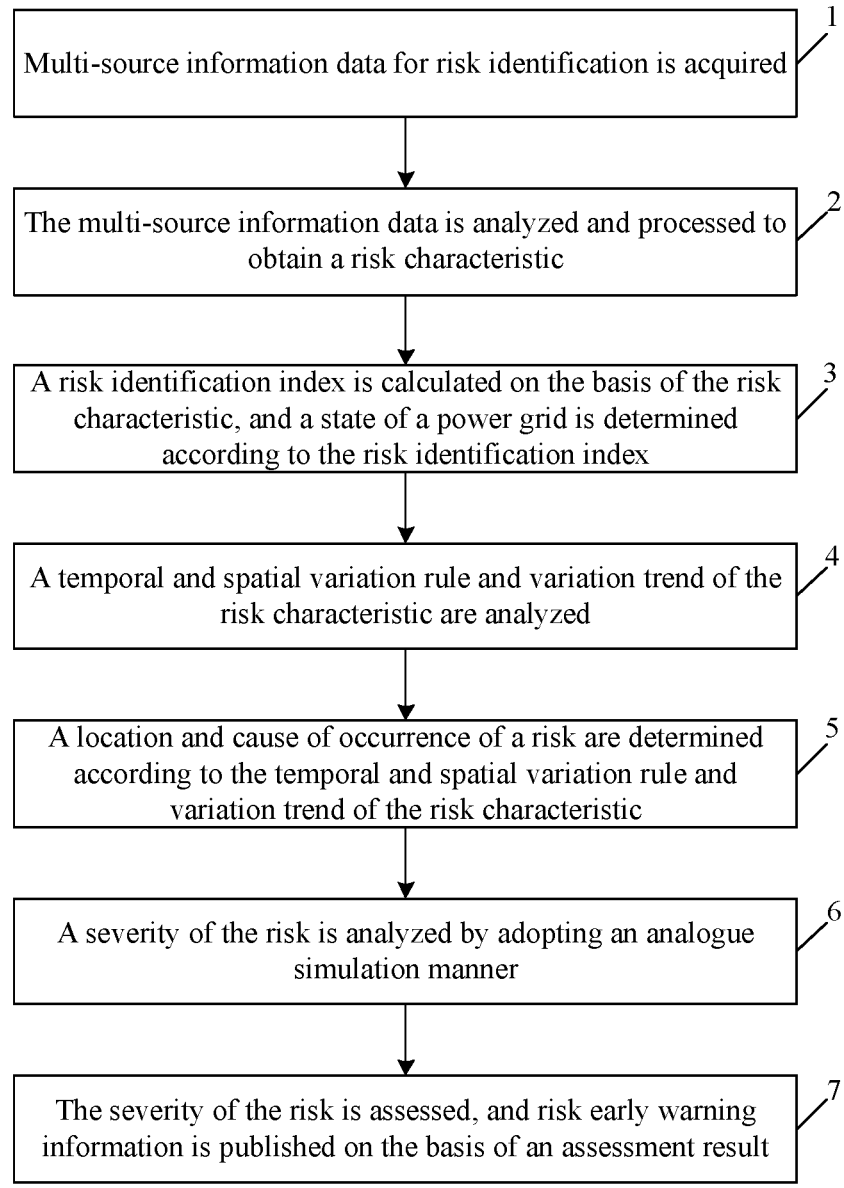
FIG. 2 is a flowchart of a distribution network risk identification method according to an embodiment of the disclosure.

On the basis of the distribution network risk identification system, the embodiments of the disclosure further provide a distribution network risk identification method. FIG. 2 is a flowchart of a distribution network risk identification method according to an embodiment of the disclosure. As shown in FIG. 2, the method includes that: when a continuous variation condition of an operation parameter (an electrical quantity parameter such as a voltage, a current and impedance and an nonelectrical quantity parameter such as a temperature and a humidity) within a time period exceeds an allowed value specified by operation, it is determined that a distribution network is in a risk state.

In Step 1, multi-source information data required by risk identification is acquired.

Here, the operation that the multi-source information data for risk identification is acquired includes that: at least one of the following data is acquired: data of a real-time power grid operation monitoring system, dynamic data and static data of an equipment PMS and external environmental information data.

Herein, the multi-source information data comes from at least three types of systems: the first is the real-time power grid operation monitoring system, and the real-time power grid operation monitoring system includes dispatching automation, distribution automation and marketing systems; the second is a PMS acquiring the dynamic data and static data of a power grid, for example, a PMS/GIS and a power customer service system (for example, a 95598 system); and the third is a system capable of obtaining the external environmental information data, for example, a weather forecasting system, a lightning monitoring system and a contamination monitoring system. A network topology, substation graph, related equipment parameter, real-time data, failure data and the like of a high-voltage distribution network (including 35 kV and 110 kV) may be acquired from the dispatching automation system; model and graph information of a medium-voltage distribution network (including 10 kV and 20 kV) may be acquired from the PMS/GIS, herein a graph represented by the graph information includes: an in-station primary connection diagram, a single line diagram, a system diagram (including a dispatching system diagram, a power supply range diagram, a switching station diagram and the like), a geographic along-the-line distribution diagram and the like; real-time information and power interruption information of a distribution transformer are acquired from the power utilization information acquisition; information such as customer service information, policies, regulations, power charges, electricity quantities, malfunction service, complaints and failure interruption notices is acquired from the power customer service system; electric power information, customer payment information, customer service information and the like acquired and monitored in real time are acquired from a power marketing management information system (for example, an SG186 system, the SG186 system being an integrated enterprise-level information integration platform of the State Grid); and stored information such as a distribution network model section, real-time data, failure information, historical data and a distribution network analysis result is acquired from the distribution automation system.

In Step 2, the multi-source information data is analyzed and processed to obtain a risk characteristic.

Here, the operation that the multi-source information data is analyzed and processed to obtain the risk characteristic includes that: fusion analysis processing is performed on the multi-source information data by adopting at least one of the following processing manners to obtain the risk characteristic: an evidence theory method, a fuzzy set method, a rough set method and a neural network method.

In Step 3, a risk identification index is calculated on the basis of the risk characteristic, and a state of a power grid is determined according to the risk identification index.

Here, the operation that the risk identification index is calculated on the basis of the risk characteristic includes that: a risk identification model and an analysis method are selected from a risk identification model base and an analysis method base according to the risk characteristic, and the risk identification index is calculated on the basis of the selected risk identification model and analysis method; and the risk identification index includes at least one of the following index parameters: power quality, an overload, overheat, a low voltage, insulating resistance and a leakage current. Furthermore, the operation that the state of the power grid is determined according to the risk identification index includes that: whether the power grid is in a risk state is determined according to a threshold value or limit value corresponding to the risk identification index, a preset risk type and a preset early warning rule.

Herein, the risk identification model and the analysis method are selected from the risk identification model base and the analysis method base according to the risk characteristic obtained by monitoring or statistics, at least one of the risk identification indexes of the power quality, the overload, the overheat, the low voltage, the insulating resistance, the leakage current and the like is calculated, and whether the power grid is in the risk state and a risk type the power grid is confronted with are determined according to the threshold value or limit value corresponding to the risk identification index, the preset risk type and the preset early warning rule, herein the preset risk type and the preset early warning rule may be created in the following two manners: first, presetting according to related experiential knowledge of an operator, and second, are automatic pre-generation from historical warning records and monitoring statistics by a data mining method.

In Step 4, a temporal and spatial variation rule and variation trend of the risk characteristic are analyzed.

Here, the temporal and spatial variation rule and variation trend of the risk characteristic are analyzed by adopting a continuous monitoring or statistical method.

In Step 5, a location and cause of occurrence of a risk are determined according to the temporal and spatial variation rule and variation trend of the risk characteristic.

Here, the location of occurrence of the risk is determined based on a combination of experiential knowledge of the operator of the power grid according to the temporal and spatial variation rule and variation trend, obtained by multi-source information data fusion, of the risk characteristic; and the cause of occurrence of the risk is analyzed by adopting a method such as a relevance analysis method and/or the evidence theory method based on a combination of the experiential knowledge mined from historical records of failure information according to the risk characteristic obtained by multi-source information data fusion and information sources and according to a causal association relationship between a risk event, a risk characteristic and a risk type.

In Step 6, a severity of the risk is analyzed by adopting an analogue simulation manner.

Here, the operation that the severity of the risk is analyzed by adopting the analogue simulation manner includes that: Monte Carlo simulation is performed on the risk to obtain a probability of the risk and obtain the severity of the risk.

Herein, a Monte Carlo method, also called as a random sampling or statistical testing method, belongs to a branch of computational mathematics, and it was developed for adaptability to development of the atomic energy undertaking of that time in mid-1940s. A conventional empirical method may not implement an approximately real physical process, so that it is hard to obtain a satisfactory result. The Monte Carlo method may actually simulate a practical physical process, so that practical problems may be solved, and a satisfactory result may be obtained.

A basic thought of the Monte Carlo method is that: when a problem to be solved is a probability of occurrence of a certain event or an expected value of a certain random variable, a frequency of occurrence of the event or an average value of the random variable may be obtained by a certain "testing" method, and it is determined as a solution to the problem.

Monte Carlo implements analogue simulation of a frequency of occurrence of the risk of the power grid by testing, and analyzes a consequence and severity of the risk according to the probability.

In Step 7, the severity of the risk is assessed, and risk early warning information is issued on the basis of an assessment result.

Here, the operation that the severity of the risk is assessed and the risk early warning information is issued on the basis of the assessment result includes that: the risk is comprehensively assessed based on a combination of a condition such as a risk type, a risk source location, the cause of the risk and the severity of the risk, and the risk early warning information is issued based on a combination of a set risk early warning information evaluation and publication standard according to selection and requirement of a user.

The embodiments of the disclosure further provide a distribution network risk identification system, which includes: a memory, a processor and a computer program stored on the memory and capable of being run on the processor, the processor executing the program to implement the steps of the distribution network risk identification method of the embodiments of the disclosure.

Specifically, the processor executes the program to implement that: multi-source information data for risk identification is acquired; the multi-source information data is analyzed and processed to obtain a risk characteristic; a risk identification index is calculated on the basis of the risk characteristic, and a state of a power grid is determined according to the risk identification index; a temporal and spatial variation rule and variation trend of the risk characteristic are analyzed; a location and cause of occurrence of a risk are determined according to the temporal and spatial variation rule and variation trend of the risk characteristic; a severity of the risk is analyzed by adopting an analogue simulation manner; and the severity of the risk is assessed, and risk early warning information is issued on the basis of an assessment result.

As an implementation mode, the processor executes the program to implement that: at least one of the following data is acquired: data of a real-time power grid operation monitoring system, dynamic data and static data of an equipment PMS and external environmental information data.

As an implementation mode, the processor executes the program to implement that: fusion analysis processing is performed on the multi-source information data by adopting at least one of the following processing manners to obtain the risk characteristic: an evidence theory method, a fuzzy set method, a rough set method and a neural network method.

As an implementation mode, the processor executes the program to implement that: a risk identification model and an analysis method are selected from a risk identification model base and an analysis method base according to the risk characteristic, and the risk identification index is calculated on the basis of the selected risk identification model and analysis method; and the risk identification index includes at least one of the following index parameters: power quality, an overload, overheat, a low voltage, insulating resistance and a leakage current.

As an implementation mode, the processor executes the program to implement that: whether the power grid is in a risk state is determined according to a threshold value or limit value corresponding to the risk identification index, a preset risk type and a preset early warning rule.

As an implementation mode, the processor executes the program to implement that: the temporal and spatial variation rule and variation trend of the risk characteristic are analyzed by adopting a continuous monitoring or statistical method.

As an implementation mode, the processor executes the program to implement that: the preset risk type and the preset early warning rule are preset according to related experiential knowledge, or the preset risk type and the preset early warning rule are automatically pre-generated from historical warning records and monitoring statistics by a data mining method.

As an implementation mode, the processor executes the program to implement that: the cause of occurrence of the risk is analyzed by adopting a relevance analysis method and/or the evidence theory method.

As an implementation mode, the processor executes the program to implement that: Monte Carlo simulation is performed on the risk to obtain a probability of the risk and obtain the severity of the risk.

As an implementation mode, the processor executes the program to implement that: the risk is comprehensively assessed based on a combination of a risk type, a risk source location, the cause of the risk and the severity of the risk; and the risk early warning information is issued based on a combination of a set risk early warning information evaluation and publication standard.

It can be understood that the memory may be a volatile memory or a nonvolatile memory, or may also include both the volatile and nonvolatile memories, herein the nonvolatile memory may be a Read Only Memory (ROM), a Programmable Read-Only Memory (PROM), an Erasable PROM (EPROM), an Electrically EPROM (EEPROM), a Ferromagnetic Random Access Memory (FRAM), a flash memory, a magnetic surface memory, an optical disk or a Compact Disc Read-Only Memory (CD-ROM); and the magnetic surface memory may be a disk memory or a tape memory. The volatile memory may be Random Access Memory (RAM), and is used as an external high-speed cache. It is exemplarily but unlimitedly described that RAMs in various forms may be adopted, such as a Static RAM (SRAM), a Synchronous SRAM (SSRAM), a Dynamic RAM (DRAM), a Synchronous DRAM (SDRAM), a Double Data Rate SDRAM (DDRSDRAM), an Enhanced SDRAM (ESDRAM), a Synchlink DRAM (SLDRAM) and a Direct Rambus RAM (DR RAM). The memory described in the embodiments of the disclosure is intended to include, but not limited to, memories of these or any other proper types.

The method disclosed by the embodiments of the disclosure may be applied to a processor or implemented by the processor. The processor may be an integrated circuit chip with a signal processing capability. In an implementation process, each step of the method may be completed by an integrated logical circuit of hardware in the processor or an instruction in a software form. The processor may be a universal processor, a Digital Signal Processor (DSP), or another programmable logical device, discrete gate or transistor logical device, discrete hardware component and the like. The processor may implement or execute each method, step and logic block diagram disclosed in the embodiments of the disclosure. The universal processor may be a micro-processor or any conventional processor and the like. The steps of the method disclosed based on a combination of the embodiments of the disclosure may be directly embodied to be executed and completed by a hardware decoding processor or executed and completed by a combination of hardware and software modules in the decoding processor. The software module may be located in a storage medium, the storage medium is located in a memory, and the processor reads information in the memory, and completes the steps of the method based on a combination of hardware.

In an exemplary embodiment, the system may be implemented by one or more Application Specific Integrated Circuits (ASICs), DSPs, Programmable Logic Devices (PLDs), Complex Programmable Logic Devices (CPLDs), Field-Programmable Gate Arrays (FPGAs), universal processors, controllers, Micro Controller Units (MCUs), microprocessors or other electronic components, and is configured to execute the method.

The embodiments of the disclosure further provide a computer storage medium, which may be a memory such as an FRAM, a ROM, a PROM, an EPROM, an EEPROM, a flash memory, a magnetic surface memory, an optical disk or a CD-ROM, and may also be various kinds of equipment including one or any combination of the memories. A computer program is stored in the computer storage medium, and the computer program is run by a processor to execute that: multi-source information data for risk identification is acquired; the multi-source information data is analyzed and processed to obtain a risk characteristic; a risk identification index is calculated on the basis of the risk characteristic, and a state of a power grid is determined according to the risk identification index; a temporal and spatial variation rule and variation trend of the risk characteristic are analyzed; a location and cause of occurrence of a risk are determined according to the temporal and spatial variation rule and variation trend of the risk characteristic; a severity of the risk is analyzed by adopting an analogue simulation manner; and the severity of the risk is assessed, and risk early warning information is issued on the basis of an assessment result.

As an implementation mode, the computer program is run by the processor to execute that: at least one of the following data is acquired: data of a real-time power grid operation monitoring system, dynamic data and static data of an equipment PMS and external environmental information data.

As an implementation mode, the computer program is run by the processor to execute that: fusion analysis processing is performed on the multi-source information data by adopting at least one of the following processing manners to obtain the risk characteristic: an evidence theory method, a fuzzy set method, a rough set method and a neural network method.

As an implementation mode, the computer program is run by the processor to execute that: a risk identification model and an analysis method are selected from a risk identification model base and an analysis method base according to the risk characteristic, and the risk identification index is calculated on the basis of the selected risk identification model and analysis method; and the risk identification index includes at least one of the following index parameters: power quality, an overload, overheat, a low voltage, insulating resistance and a leakage current.

As an implementation mode, the computer program is run by the processor to execute that: whether the power grid is in a risk state is determined according to a threshold value or limit value corresponding to the risk identification index, a preset risk type and a preset early warning rule.

As an implementation mode, the computer program is run by the processor to execute that: the temporal and spatial variation rule and variation trend of the risk characteristic are analyzed by adopting a continuous monitoring or statistical method.

As an implementation mode, the computer program is run by the processor to execute that: the preset risk type and the preset early warning rule are preset according to related experiential knowledge, or the preset risk type and the preset early warning rule are automatically pre-generated from historical warning records and monitoring statistics by a data mining method.

As an implementation mode, the computer program is run by the processor to execute that: the cause of occurrence of the risk is analyzed by adopting a relevance analysis method and/or the evidence theory method.

As an implementation mode, the computer program is run by the processor to execute that: Monte Carlo simulation is performed on the risk to obtain a probability of the risk and obtain the severity of the risk.

As an implementation mode, the computer program is run by the processor to execute that: the risk is comprehensively assessed based on a combination of a risk type, a risk source location, the cause of the risk and the severity of the risk; and the risk early warning information is issued based on a combination of a set risk early warning information evaluation and publication standard.

In some embodiments provided by the disclosure, it should be understood that the disclosed method and system may be implemented in another manner. The system embodiment described above is only schematic, and for example, division of the modules is only logic function division, and other division manners may be adopted during practical implementation. For example, multiple modules or components may be combined or integrated into another system, or some characteristics may be neglected or not executed. In addition, communication connection between each displayed or discussed component may be indirect coupling or communication connection, implemented through some interfaces, of the equipment or the modules, and may be electrical and mechanical or adopt other forms.

The modules described as separate parts may or may not be physically separated, and parts displayed as modules may or may not be physical modules, and namely may be located in the same place, or may also be distributed to multiple network modules. Part or all of the modules may be selected to achieve the purpose of the solutions of the embodiments according to a practical requirement.

In addition, each function module in each embodiment of the disclosure may be integrated into a processing module, each module may also exist independently, and two or more than two modules may also be integrated into a module. The integrated module may be implemented in a hardware form, and may also be implemented in form of hardware and software function unit.

Those skilled in the art should know that: all or part of the steps of the method embodiment may be implemented by instructing related hardware through a program, the program may be stored in a computer-readable storage medium, and the program is executed to execute the steps of the method embodiment; and the storage medium includes: various media capable of storing program codes such as mobile storage equipment, a ROM, a magnetic disk or an optical disk.

Or, when being implemented in form of software function module and sold or used as an independent product, the integrated module of the embodiments of the disclosure may also be stored in a computer-readable storage medium. Based on such an understanding, the technical solutions of the embodiments of the disclosure substantially or parts making contributions to the conventional art may be embodied in form of software product, and the computer software product is stored in a storage medium, including a plurality of instructions configured to enable a piece of computer equipment (which may be a personal computer, a server, network equipment or the like) to execute all or part of the method in each embodiment of the disclosure. The storage medium includes: various media capable of storing program codes such as mobile storage equipment, a ROM, a magnetic disk or an optical disk.

A memory switching method and device recorded in the embodiments of the disclosure are described not limitedly but only exemplarily with the above embodiments. Those skilled in the art should know that modifications may still be made to the technical solutions recorded in each embodiment, or equivalent replacements may still be made to part or all of the technical characteristics; and these modifications or replacements do not make the essence of the corresponding technical solutions depart from the scope of the technical solutions of each embodiment of the disclosure.

The above is only the preferred embodiment of the disclosure and not intended to limit the scope of protection of the disclosure.

INDUSTRIAL APPLICABILITY

According to the technical solutions of the embodiments of the disclosure, on one hand, barriers of various data source systems of a distribution network are broken, and data provided by multiple information sources is effectively fused to provide a data support for accurate distribution network risk identification. On the other hand, distribution network risk identification is performed from multiple dimensions of time, space and the like according to different assessment scenarios, assessment objects, assessment ranges and assessment periods. In addition, the cause and source of occurrence of the risk are searched and found from a micro level, and a decision-making basis is provided for formulation of an effective risk prevention and control measure.

The invention claimed is:

1. A distribution network risk identification method, applied to a distribution network risk identification system including a processor, the method comprising:
    acquiring, by the processor, multi-source information data for risk identification;
    analyzing, by the processor, and processing the multi-source information data to obtain a risk characteristic;
    calculating, by the processor, a risk identification index on the basis of the risk characteristic, and determining a state of a power grid according to the risk identification index;
    analyzing, by the processor, a temporal and spatial variation rule and variation trend of the risk characteristic;
    determining, by the processor, a location of occurrence of a risk according to the temporal and spatial variation rule and variation trend of the risk characteristic, and determining a cause of occurrence of the risk according to a causal association relationship between a risk event, the risk characteristic and a risk type;
    analyzing, by the processor, a severity of the risk by adopting an analogue simulation manner; and
    assessing, by the processor, the severity of the risk, and issuing risk early warning information on the basis of an assessment result,
    wherein said analyzing, by the processor, and processing the multi-source information data to obtain the risk characteristic comprises:
    performing fusion analysis processing on the multi-source information data by adopting at least one of the following processing manners to obtain the risk characteristic: an evidence theory method, a fuzzy set method, a rough set method and a neural network method.

2. The distribution network risk identification method according to claim 1, wherein acquiring the multi-source information data for risk identification comprises:
    acquiring at least one of: data of a real-time power grid operation monitoring system, dynamic data and static data of an equipment Production Management System (PMS) and external environmental information data.

3. The distribution network risk identification method according to claim 1, wherein calculating the risk identification index on the basis of the risk characteristic comprises:
    selecting a risk identification model and an analysis method from a risk identification model base and an analysis method base according to the risk characteristic, and calculating the risk identification index on the basis of the selected risk identification model and analysis method; and
    the risk identification index comprises at least one of the following index parameters: power quality, an overload, overheat, a low voltage, insulating resistance and a leakage current.

4. The distribution network risk identification method according to claim 1, wherein determining the state of the power grid according to the risk identification index comprises: determining whether the power grid is in a risk state according to a threshold value or limit value corresponding to the risk identification index, a preset risk type and a preset early warning rule.

5. The distribution network risk identification method according to claim 1, wherein analyzing the temporal and spatial variation rule and variation trend of the risk characteristic comprises:
    analyzing the temporal and spatial variation rule and variation trend of the risk characteristic by adopting a continuous monitoring or statistical method.

6. The distribution network risk identification method according to claim 4, wherein the preset risk type and the preset early warning rule are preset according to related experiential knowledge, or are automatically pre-generated from historical warning records and monitoring statistics by a data mining method.

7. The distribution network risk identification method according to claim 1, wherein the cause of occurrence of the risk is analyzed by adopting a relevance analysis method and/or an evidence theory method.

8. The distribution network risk identification method according to claim 1, wherein analyzing the severity of the risk by adopting the analogue simulation manner comprises: performing Monte Carlo simulation on the risk to obtain a probability of the risk and obtain the severity of the risk.

9. The distribution network risk identification method according to claim 1, wherein assessing the severity of the risk and issuing the risk early warning information on the basis of the assessment result comprises:

comprehensively assessing the risk based on a combination of the risk type, a risk source location, the cause of the risk and the severity of the risk; and issuing the risk early warning information based on a combination of a set risk early warning information evaluation and publication standard.

10. A distribution network risk identification system, comprising:

a processor; and memory for storing instructions executable by the processor, wherein the processor is arranged to:

acquire multi-source information data for risk identification;

analyze and process the multi-source information data to obtain a risk characteristic;

calculate a risk identification index on the basis of the risk characteristic, and determine a state of a power grid according to the risk identification index;

analyze a temporal and spatial variation rule and variation trend of the risk characteristic;

determine a location of occurrence of a risk according to the temporal and spatial variation rule and variation trend of the risk characteristic, and determine a cause of occurrence of the risk according to a causal association relationship between a risk event, the risk characteristic and a risk type;

analyze a severity of the risk by adopting an analogue simulation manner; and assess the severity of the risk, and issue risk early warning information on the basis of an assessment result, wherein the processor, when arranged to analyze and process the multi-source information data to obtain the risk characteristic, is further arranged to perform fusion analysis processing on the multi-source information data by adopting at least one of the following processing manners to obtain the risk characteristic: an evidence theory method, a fuzzy set method, a rough set method and a neural network method.

11. A non-transitory computer storage medium having stored thereon computer-executable instructions configured to execute the steps of a distribution network risk identification method, the method comprising:

acquiring multi-source information data for risk identification;

analyzing and processing the multi-source information data to obtain a risk characteristic;

calculating a risk identification index on the basis of the risk characteristic, and determining a state of a power grid according to the risk identification index;

analyzing a temporal and spatial variation rule and variation trend of the risk characteristic;

determining a location of occurrence of a risk according to the temporal and spatial variation rule and variation trend of the risk characteristic, and determining a cause of occurrence of the risk according to a causal association relationship between a risk event, the risk characteristic and a risk type;

analyzing a severity of the risk by adopting an analogue simulation manner; and assessing the severity of the risk, and issuing risk early warning information on the basis of an assessment result, wherein said analyzing and processing the multi-source information data to obtain the risk characteristic comprises:

performing fusion analysis processing on the multi-source information data by adopting at least one of the following processing manners to obtain the risk characteristic: an evidence theory method, a fuzzy set method, a rough set method and a neural network method.

12. The distribution network risk identification system according to claim 10, wherein acquiring the multi-source information data for risk identification comprises:

acquiring at least one of: data of a real-time power grid operation monitoring system, dynamic data and static data of an equipment Production Management System (PMS) and external environmental information data.

13. The distribution network risk identification system according to claim 10, wherein calculating the risk identification index on the basis of the risk characteristic comprises: selecting a risk identification model and an analysis method from a risk identification model base and an analysis method base according to the risk characteristic, and calculating the risk identification index on the basis of the selected risk identification model and analysis method; and the risk identification index comprises at least one of the following index parameters: power quality, an overload, overheat, a low voltage, insulating resistance and a leakage current.

14. The distribution network risk identification system according to claim 10, wherein determining the state of the power grid according to the risk identification index comprises: determining whether the power grid is in a risk state according to a threshold value or limit value corresponding to the risk identification index, a preset risk type and a preset early warning rule.

15. The distribution network risk identification system according to claim 10, wherein analyzing the temporal and spatial variation rule and variation trend of the risk characteristic comprises:

analyzing the temporal and spatial variation rule and variation trend of the risk characteristic by adopting a continuous monitoring or statistical method.

16. The distribution network risk identification system according to claim 14, wherein the preset risk type and the preset early warning rule are preset according to related experiential knowledge, or are automatically pre-generated from historical warning records and monitoring statistics by a data mining method.

17. The distribution network risk identification system according to claim 10, wherein the cause of occurrence of the risk is analyzed by adopting a relevance analysis method and/or an evidence theory method.

18. The distribution network risk identification system according to claim 10, wherein analyzing the severity of the risk by adopting the analogue simulation manner comprises: performing Monte Carlo simulation on the risk to obtain a probability of the risk and obtain the severity of the risk.

* * * * *